(12) United States Patent
Champion et al.

(10) Patent No.: US 8,007,287 B1
(45) Date of Patent: Aug. 30, 2011

(54) CONNECTOR SYSTEM HAVING CONTACT OVERLAPPING VIAS

(75) Inventors: Bruce Allen Champion, Lemoyne, PA (US); Steven Jay Millard, Mechanicsburg, PA (US); Bin Lin, Hummelstown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/728,879

(22) Filed: Mar. 22, 2010

(51) Int. Cl.
*H01R 12/00* (2006.01)

(52) U.S. Cl. .......................................................... 439/66

(58) Field of Classification Search .................. 439/66, 439/74, 76.1, 79, 82, 75, 324, 248, 91
See application file for complete search history.

(56) References Cited

U.S. PATENT DOCUMENTS

| | | | |
|---|---|---|---|
| 5,173,055 A * | 12/1992 | Grabbe | 439/66 |
| 5,282,312 A * | 2/1994 | DiStefano et al. | 29/830 |
| 6,074,219 A * | 6/2000 | Tustaniwskyj et al. | 439/66 |
| 6,274,820 B1 * | 8/2001 | DiStefano et al. | 174/254 |
| 6,302,703 B1 * | 10/2001 | Bestul et al. | 439/66 |
| 6,392,301 B1 * | 5/2002 | Waizman et al. | 257/774 |
| 6,905,343 B1 * | 6/2005 | Neidich | 439/66 |
| 2002/0055280 A1 * | 5/2002 | Ko | 439/63 |
| 2002/0055282 A1 | 5/2002 | Eldridge et al. | |
| 2004/0072456 A1 * | 4/2004 | Dozier et al. | 439/83 |
| 2006/0163715 A1 * | 7/2006 | Pendse | 257/691 |
| 2006/0232301 A1 | 10/2006 | Morlion et al. | |

* cited by examiner

*Primary Examiner* — Neil Abrams
*Assistant Examiner* — Phuongchi T Nguyen

(57) ABSTRACT

An electronic connector system includes an electronic package and an interposer connector assembly. The electronic package has a body with a conductive member disposed on a mating surface of the body. The conductive member is coupled with a conductive via that extends into the body and is oriented along a center axis. The interposer connector assembly includes a substrate with an elongated conductive pad mounted to the substrate and a contact joined to the conductive pad. The contact engages the conductive member when the electronic package mates with the interposer connector assembly such that the center axis extends through the contact.

16 Claims, 6 Drawing Sheets

CONNECTOR SYSTEM HAVING CONTACT OVERLAPPING VIAS

BACKGROUND OF THE INVENTION

The invention relates generally to connectors that electrically couple two or more other connectors or devices, and more specifically, to an interposer connector assembly.

The ongoing trend toward smaller, lighter, and higher performance electrical components and higher density electrical circuits has led to the development of surface mount technology in the design of printed circuit boards and electronic packages. Surface mountable packaging allows for the connection of a package, such as a computer processor, to pads on the surface of the circuit board rather than by contacts or pins soldered in plated holes going through the circuit board. Surface mount technology may allow for an increased component density on a circuit board, thereby saving space on the circuit board.

One form of surface mount technology includes interposer connectors. Interposer connectors may include a substrate with conductive contacts on both sides of a dielectric substrate. Conductive vias, or holes that are filled with a conductive material, extend through the substrate to electrically couple the contacts on opposite sides of the substrate. The contacts on each side of the substrate engage conductive members or terminals of different electronic packages, such as a processor and a circuit board, to electrically couple the electronic packages with each other.

As the need for smaller, lighter, and higher performance electrical components and higher density electrical circuits increases, the density of the contacts and vias on each side of the substrate may increase. For example, the contacts and vias may be located closer together. As the contacts and vias move closer together, the data and/or power signals that are conveyed between the electronic packages using the contacts and vias may induce noise, crosstalk, and other electromagnetic interference on the data signals being carried by nearby or neighboring contacts and vias.

A need exists for an interposer connector assembly that enables a relatively high density of contacts while reducing noise and other interference on signals being transferred by the contacts.

BRIEF DESCRIPTION OF THE INVENTION

In one embodiment, an electronic connector system is provided. The system includes an electronic package and an interposer connector assembly. The electronic package has a body with a conductive member disposed on a mating surface of the body. The conductive member is coupled with a conductive via that extends into the body and is oriented along a center axis. The interposer connector assembly includes a substrate with an elongated conductive pad mounted to the substrate and a contact joined to the conductive pad. The contact engages the conductive member when the electronic package mates with the interposer connector assembly such that the center axis extends through the contact.

In another embodiment, another electronic connector system is provided. The system includes an electronic package and an interposer connector assembly. The electronic package has a body with a conductive member disposed on a mating surface of the body. The conductive member is coupled with a conductive via that extends into the body. The interposer connector assembly includes a substrate with a conductive pad mounted to the substrate and an elongated contact joined to the conductive pad. The contact has a footprint on the electronic package that is defined by a surface area on the mating surface of the electronic package over which the contact extends when the electronic package and the interposer connector assembly mate. At least a portion of the via is disposed within the footprint.

DETAILED DESCRIPTION OF THE INVENTION

Figure 1:
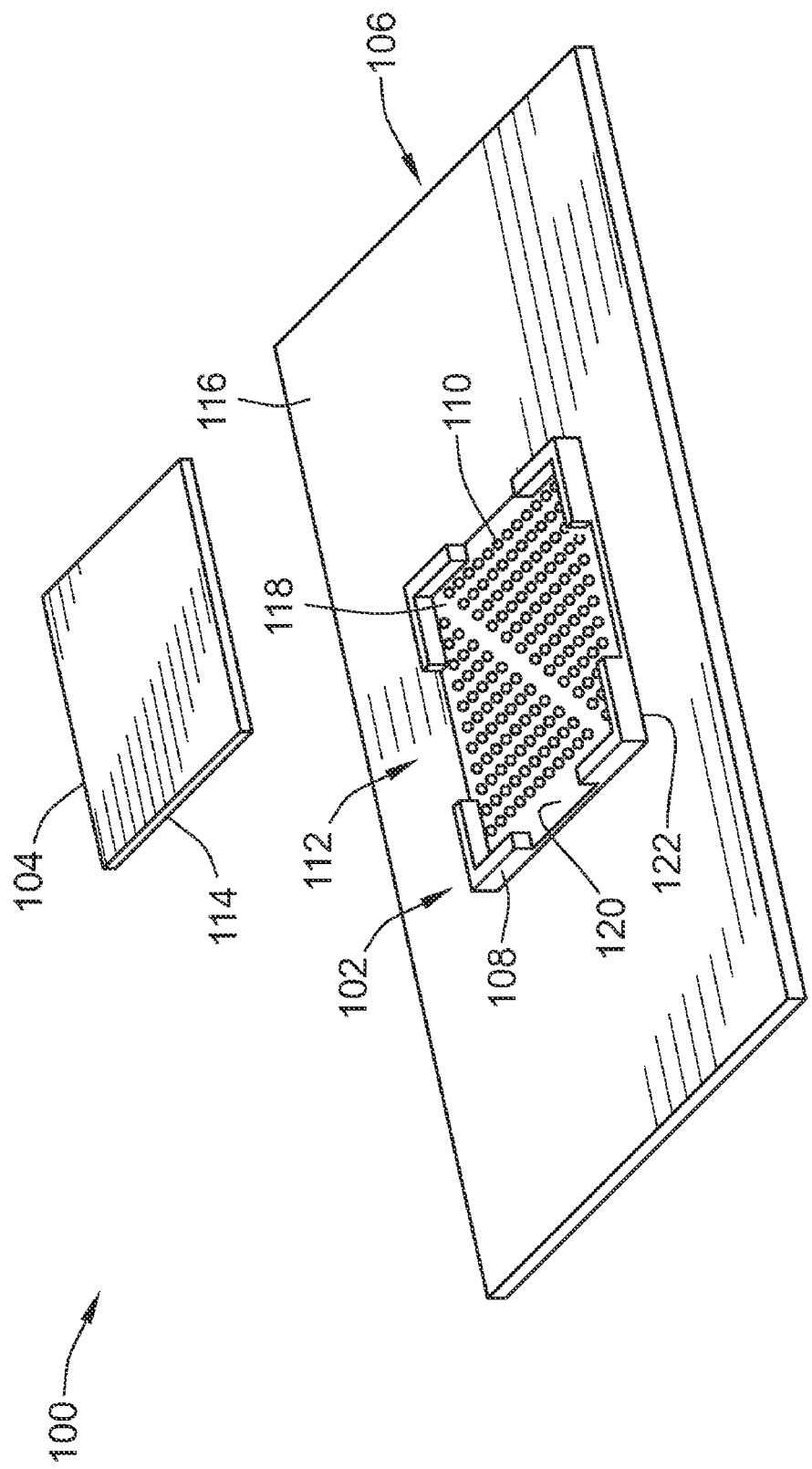
FIG. 1 illustrates an electronic connector system having an interposer connector assembly formed in accordance with one embodiment.

FIG. 1 illustrates an electronic connector system 100 having an interposer connector assembly 102 formed in accordance with one embodiment. The interposer connector assembly 102 mates with and electrically interconnects first and second electronic packages 104, 106. The electronic packages 104, 106 may be either circuit boards or electronic devices, such as land grid array (LGA) or ball grid array (BGA) devices. The LGA or BGA devices may be a chip or module, such as, but not limited to, a central processing unit (CPU), microprocessor, or an application specific integrated circuit (ASIC), or the like. The interposer connector assembly 102 may be used to establish board-to-board, board-to-device, and/or device-to-device electrical connections.

In the illustrated embodiment, the interposer connector assembly 102 is a board-to-board interconnect system that electrically joins electronic packages 104, 106, such as circuit boards. A housing 108 is used to position the interposer connector assembly 102 with respect to the first and second electronic packages 104, 106. The housing 108 may completely surround the perimeter of the interposer connector assembly 102, or alternatively, may have separate components provided at predetermined portions of the interposer connector assembly 102, as shown in FIG. 1.

The interposer connector assembly 102 includes a dielectric substrate 118 having opposite sides 120, 122. Conductive contacts 110 are coupled to the sides 120, 122 and arranged in a contact array 112 on each side 120, 122. The contacts 110 may be elongated conductive bodies that extend from the sides 120, 122 as cantilevered beams. The first electronic package 104 has a mating surface 114 and the second electronic package 106 has a mating surface 116 that each includes conductive pads 200 (shown in FIG. 2). The conductive pads 416 engage the contacts 110 to electrically couple the first and second electronic packages 104, 106 with the interposer connector assembly 102.

The contacts 110 may be joined to the sides 120, 122 by one or more intervening components, such as one or more of a conductive pad 200 (shown in FIG. 2), dielectric layer, and the like. The first and second electronic packages 104, 106 are loaded onto the opposite sides 120, 122 of the interposer connector assembly 102. The conductive pads 200 (shown in FIG. 2) of the first and second electronic packages 104, 106 engage the contacts 110 of the interposer connector assembly 102. The interposer connector assembly 102 may include conductive vias (not shown) or traces (not shown) that electrically join the first electronic package 104 with the second electronic package 106 by way of the contacts 110.

Figure 2:
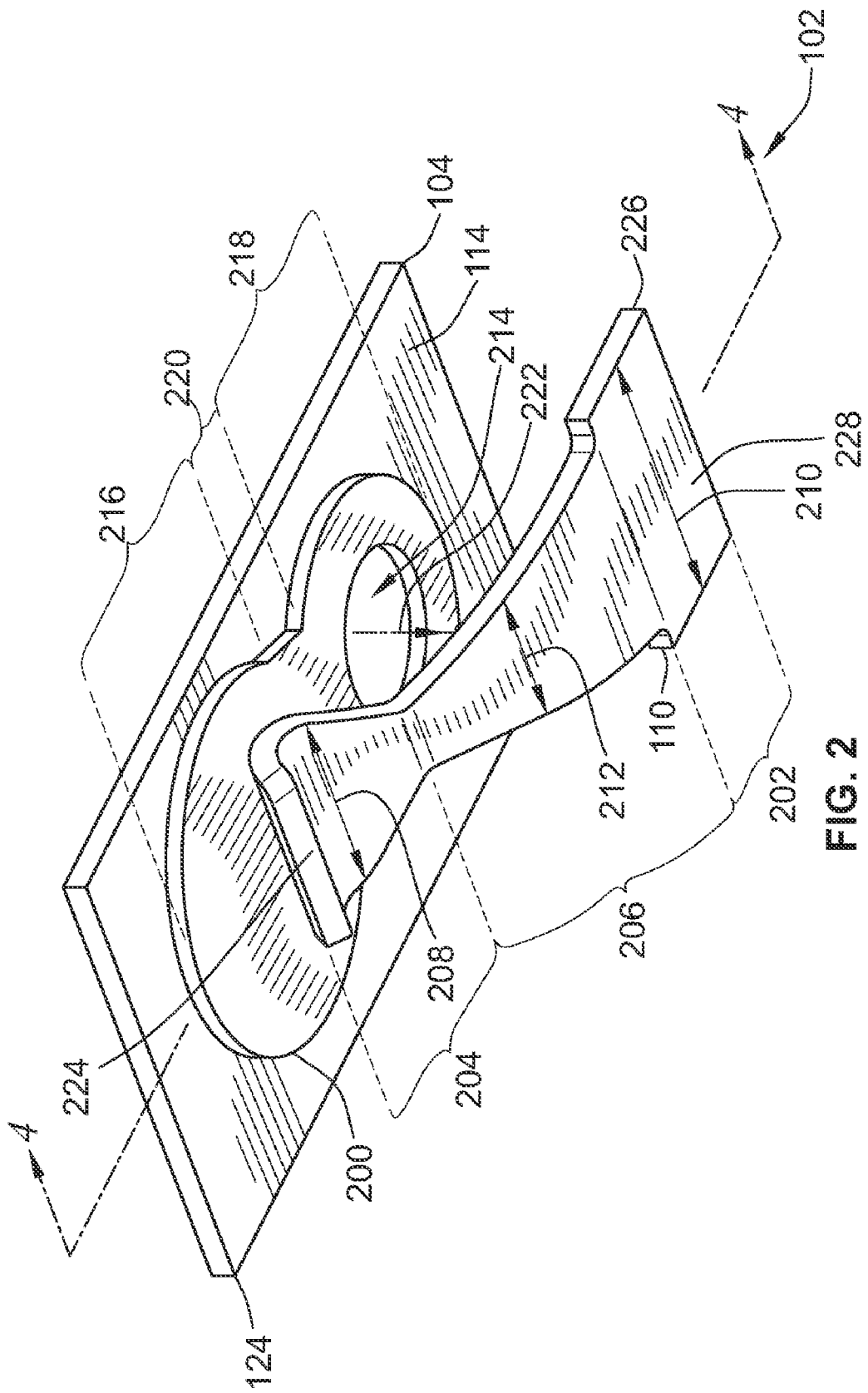
FIG. 2 is a perspective view of a contact of the interposer connector assembly shown in FIG. 1 in an uncompressed state in accordance with one embodiment.
Figure 3:
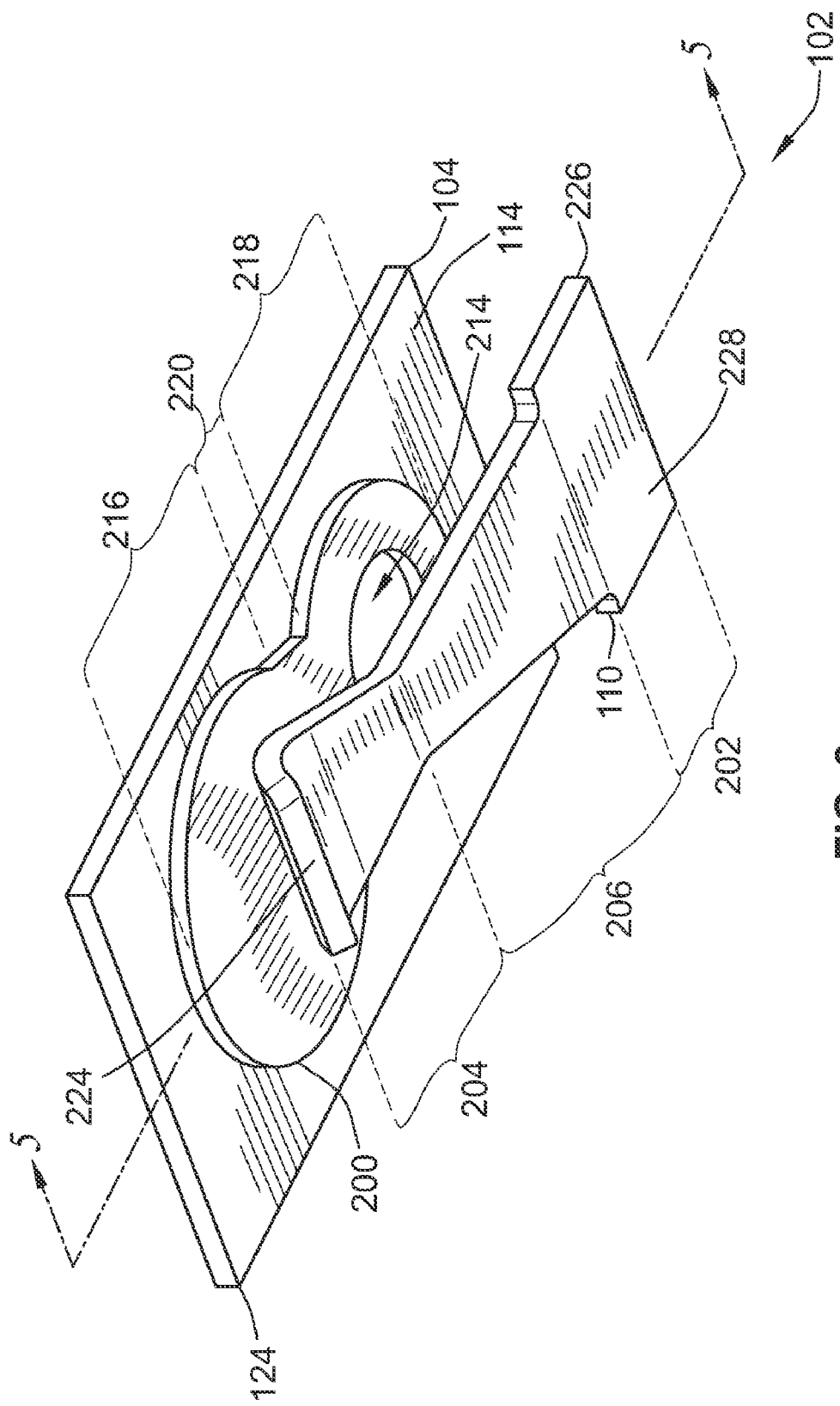
FIG. 3 is a perspective view the contact shown in FIG. 2 in a compressed state in accordance with one embodiment.

FIG. 2 is a perspective view of one of the contacts 110 of the interposer connector assembly 102 in an uncompressed state prior to mating with a conductive pad 200 of the first electronic package 104 in accordance with one embodiment. FIG. 3 is a perspective view the contact 110 shown in FIG. 2 in a compressed state and mated with the conductive pad 200 in accordance with one embodiment. The discussion herein focuses on the contacts 110 joined to the side 120 (shown in FIG. 1) of the interposer connector assembly 102 (shown in FIG. 1) and the conductive pads 200 mounted to the mating side 114 of the first electronic package 104, but may equally apply to the contacts 110 joined to the opposite side 122 (shown in FIG. 1) of the interposer connector assembly 102 and that mate with the conductive pads 200 of the second electronic package 106 (shown in FIG. 1).

The electronic package 104 includes a body 124, such as a circuit board or substrate, with conductive pads 200 mounted to the surface 114 of the body 124. The electronic package 104 includes a conductive via 214 that extends into the body 124 from the mating surface 114. The via 214 may be a cavity or opening into the first electronic package 104 that is plated or substantially filled with a conductive material. The via 214 is oriented along a center axis 222. The conductive pad 200 is electrically joined with the via 214. The conductive material of the conductive pad 200 may be coupled with the conductive material of the via 214 to provide an electrically conductive pathway between the conductive pad 200 and the via 214. The via 214 may be electrically joined with conductive traces (not shown) and/or other conductive vias of the first electronic package 104. As described herein, the contact 110 engages the conductive pad 200 to electrically couple the contact 110 and the interposer connector assembly 102 (shown in FIG. 1) with the via 214.

The contacts 110 are elongated conductive bodies that extend between opposite edges 224, 226. The contact 110 includes a fixation end 204 and an outer end 202 with an interconnecting section 206 extending from the fixation end 204 to the outer end 202. In the illustrated embodiment, the fixation end 204 and the outer end 202 have width dimensions 208, 210 (shown in FIG. 2) that are greater than a width dimension 212 (shown in FIG. 2) of the interconnecting section 206 throughout the entire interconnecting section 206. Alternatively, one or more of the width dimensions 208, 210 may be smaller than or approximately the same size as the width dimension 212.

Although not shown in FIGS. 2 and 3, the contacts 110 are joined to conductive members 402 (shown in FIG. 4) on opposite sides 120, 122 (shown in FIG. 1) of the interposer connector assembly 102 (shown in FIG. 1). For example, a mounting surface 228 of the fixation end 204 may be mounted to the conductive member 402 on the side 120 (shown in FIG. 1) of the interposer connector assembly 102 such that the contact 110 protrudes from the conductive member 402 as a cantilevered beam. In the illustrated embodiment, the fixation end 204 has a planar shape while the outer end 202 has an arcuate shape. Alternatively, the fixation and/or outer ends 204, 202 may have different shapes.

The conductive pad 200 of the first electronic package 104 engages the outer end 202 of the contact 110 when the first electronic package 104 mates with the interposer connector assembly 102. The contact 110 is shown in FIG. 2 in an uncompressed state such as, for example, when the first electronic package 104 is not mated with the interposer connector assembly 102. The contact 110 is shown in FIG. 3 in a compressed state such as when the first electronic package 104 mates with the interposer connector assembly 102 and the conductive pad 200 engages the outer end 202. The outer end 202 of the contact 110 is deflected toward the side 120 (shown in FIG. 1) of the interposer connector assembly 102 (shown in FIG. 1) when the conductive pad 200 engages the contact 110.

As shown in FIGS. 2 and 3, the conductive pad 200 may have an approximate dog-bone shape. For example, the conductive pad 200 includes two generally circular portions 216, 218 interconnected by a narrowed portion 220. The portion 216 may be referred to as an engagement portion 216 as the contact 110 may abut the engagement portion 216 of the conductive pad 200 when the contact 110 mates with the conductive pad 200. The portion 218 may be referred to as the framing portion 218 as the framing portion 218 extends around at least a portion of a periphery of the via 214 and/or the center axis 222 of the via 214. The framing portion 218 includes an opening 214 extending through the conductive pad 200. The via 214 may be at least partially encircled by the framing portion 218.

The engagement portion 216 and the framing portion 218 are spaced apart from one another and interconnected by the narrowed portion 220. The portions 216, 218, 220 may be a unitary conductive body. For example, the portions 216, 218, 220 may be plated onto the mating surface 114 of the first electronic package 104 as a single body. The narrowed portion 220 electrically interconnects the contact 110 and the mounting portion 216 with the framing portion 218 and the via 214. Alternatively, the pad 200 may have a different shape or layout than what is shown in FIGS. 2 and 3.

Figure 4:
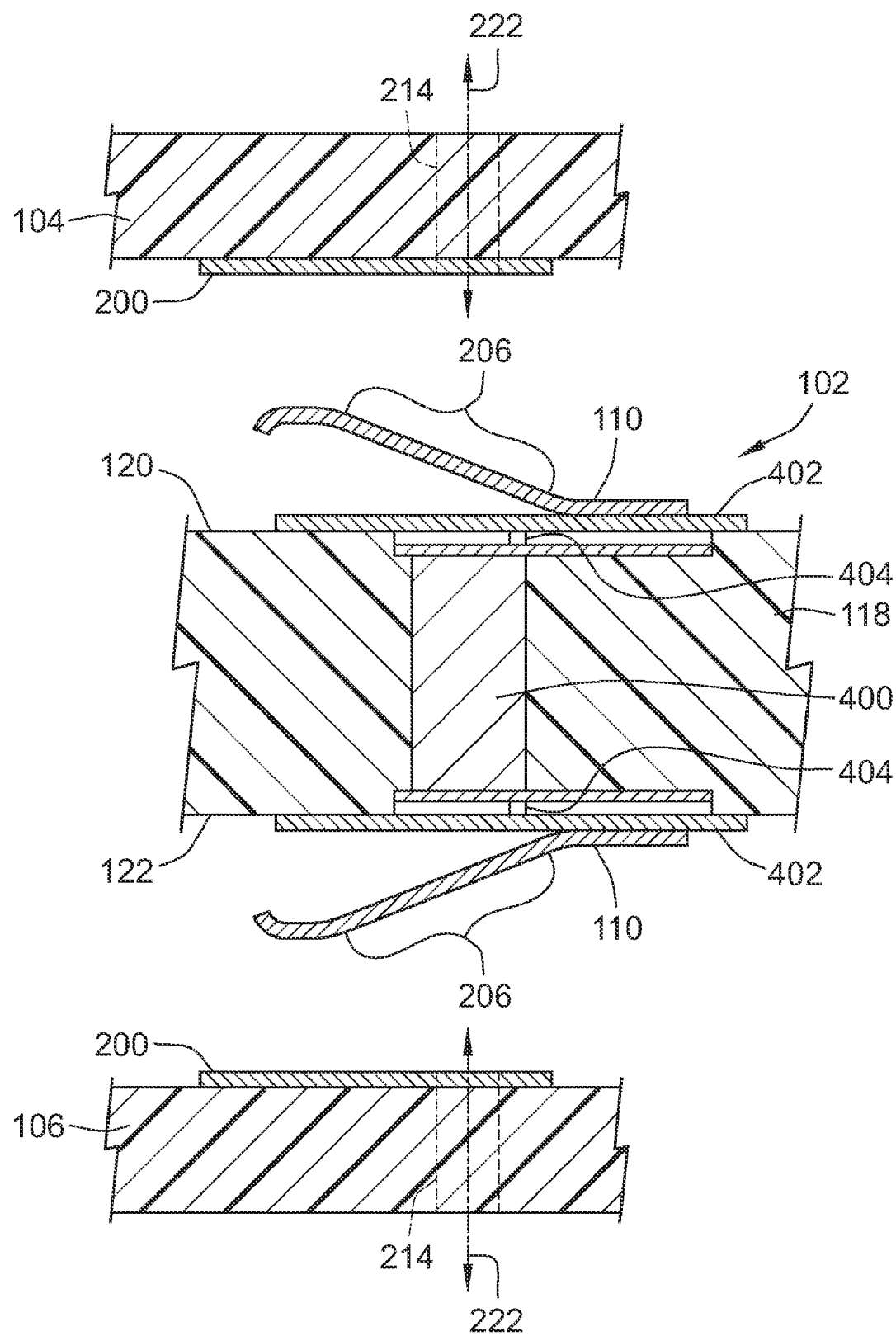
FIG. 4 is a cross-sectional view of the portion of the interposer connector assembly shown in FIG. 2 taken along line 4-4 in FIG. 2 in accordance with one embodiment.

FIG. 4 is a cross-sectional view of the portion of the interposer connector assembly 102 shown in FIG. 2 taken along line 4-4 in FIG. 2 in accordance with one embodiment. As shown in FIG. 4, each of the first and second electronic packages 104, 106 includes the conductive pad 200 and each side 120, 122 of the interposer connector assembly 102 includes the contact 110. The interposer connector assembly 102 may include conductive members 402, such as conductive pads, on each of the sides 120, 122. The contacts 110 may be mounted to and electrically coupled with the conductive members 402. A conductive via 400 may extend through the substrate 118. Conductive interconnects 404 are provided between the via 400 and the conductive members 402 to electrically couple the conductive members 402 with each other. The interconnects 404 may be conductive bodies that are deposited on the sides 120, 122 of the substrate 118. The via 400 and the interconnects 404 electrically couple the conductive members 402 and contacts 110 on the sides 120, 122 with each other. In the positions shown in FIG. 4, the conductive pads 200 of the first and second electronic packages 104, 106 are not engaged with the contacts 110 and are not electrically coupled by the interposer connector assembly 102.

The vias 214 of the first and second electronic packages 104, 106 are oriented along respective center axes 222. As shown in FIG. 4, the contacts 110 of the interposer connector assembly 102 are oriented relative to the vias 214 and the conductive pads 200 such that the center axes 222 of the vias 214 extend through the contacts 110. For example, the contacts 110 may be oriented relative to the conductive pads 200 such that the center axis 222 intersects the contacts 110. In the illustrated embodiment, the center axis 222 extends through the interconnecting portion 206 of the contacts 110, but alternatively may extend through a different part of the contacts 110.

Figure 5:
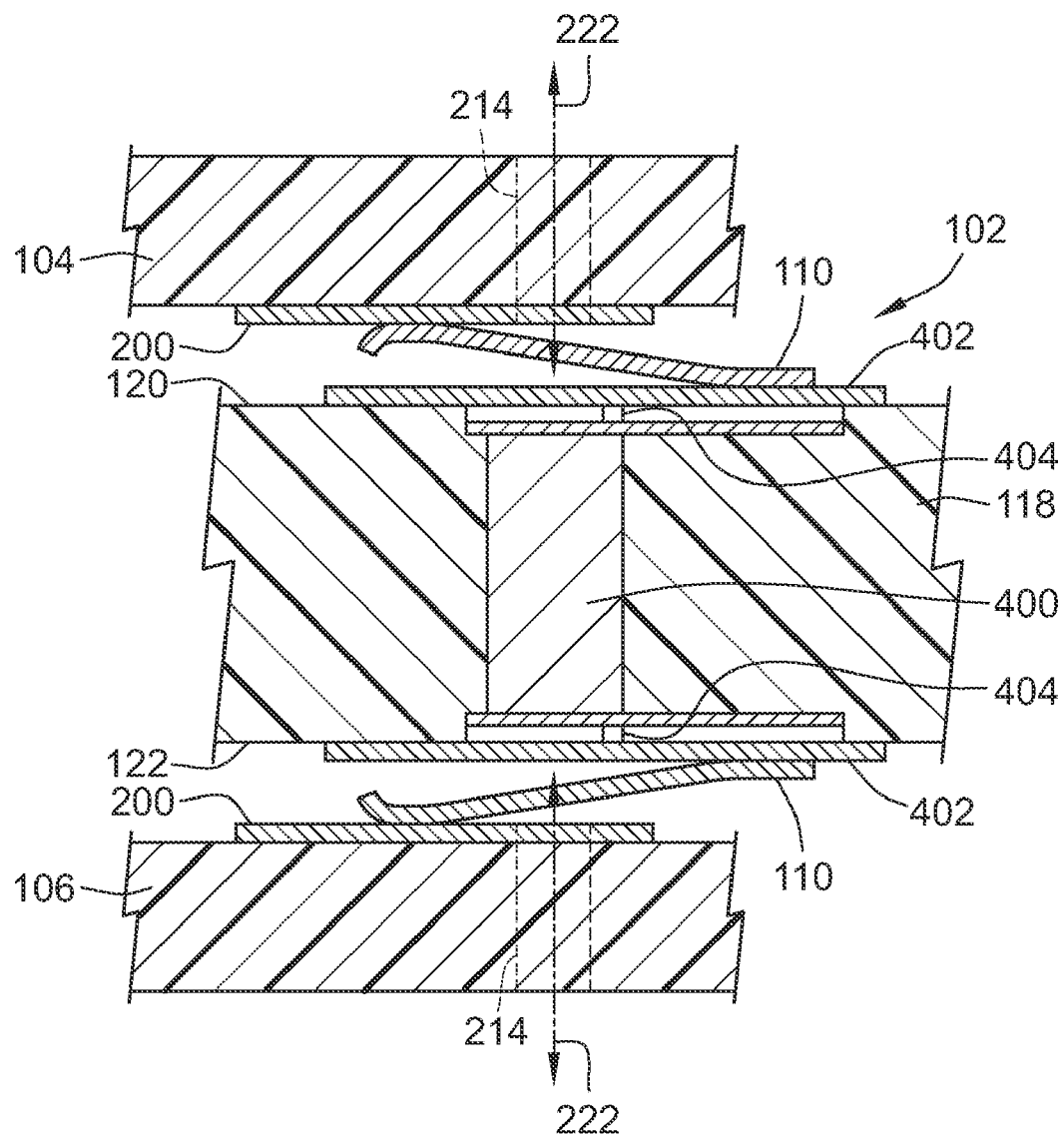
FIG. 5 is a cross-sectional view of the portion of the interposer connector assembly shown in FIG. 3 taken along line 5-5 in FIG. 3 in accordance with one embodiment.

FIG. 5 is a cross-sectional view of the portion of the interposer connector assembly 102 shown in FIG. 3 taken along line 5-5 in FIG. 3 in accordance with one embodiment. In contrast to the view shown in FIG. 4, the conductive pads 200 of the first and second electronic packages 104, 106 are engaged with the contacts 110 in the view shown in FIG. 5. The contacts 110 are deflected toward the substrate 118 of the interposer connector assembly 102 by the engagement of the contacts 110 with the conductive pads 200. In the positions shown in FIG. 5, the conductive pads 200 are electrically coupled with one another by the contacts 110, the conductive members 402, the interconnects 404, and the via 400.

The contacts 110 are deflected toward the substrate 118 with the center axes 222 of the vias 214 in the first and second electronic packages 104, 106 extending through the contacts 110 when the conductive pads 200 of the first and second electronic packages 104, 106 engage the contacts 110. Data and/or power signals may be conveyed between the first electronic package 104 and the second electronic package 106 by way of the contacts 110, the conductive members 402, the interconnects 404, and the via 400 in the illustrated embodiment. The relative positions of the contacts 110 of the interposer connector assembly 102 and the vias 214 of the first and second electronic packages 104, 106 such that the center axes 222 pass through the contacts 110 may reduce the amount or magnitude of the electrical noise or electromagnetic interference that is generated by the transfer of power and/or data through the interposer connector assembly 102. For example, positioning the contacts 110 such that the contacts 110 are located between the vias 214 of each of the first and second electronic packages 104, 106 and the conductive members 402 to which the contacts 110 are mounted may reduce the noise that the signals being conveyed through the contacts 110.

Figure 6:
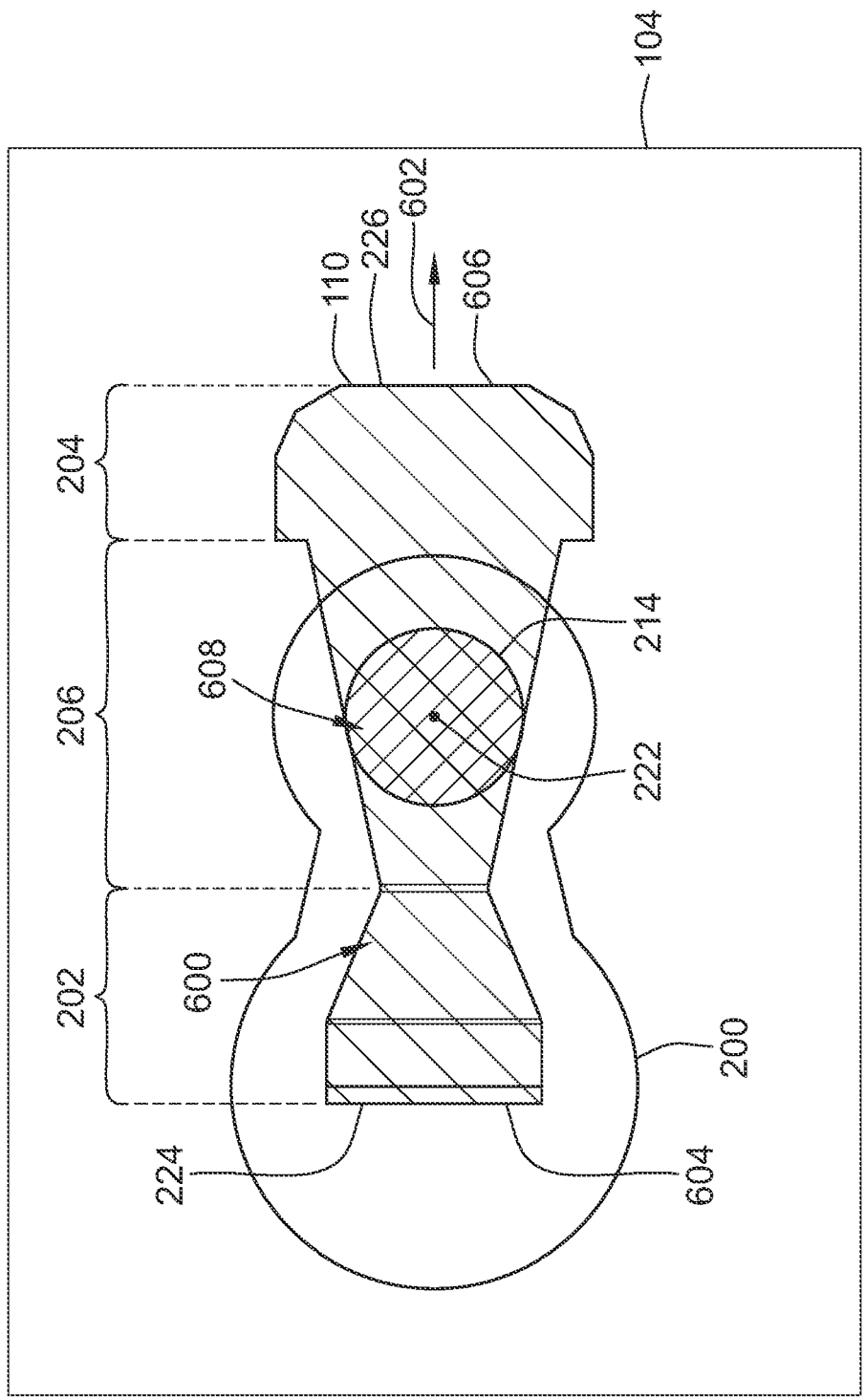
FIG. 6 is a top view of the contact of the interposer connector assembly in accordance with one embodiment.

FIG. 6 is a bottom view of one of the contacts 110 of the interposer connector assembly 102 (shown in FIG. 1) in accordance with one embodiment. The view shown in FIG. 6 is oriented along a direction extending from the side 120 (shown in FIG. 1) of the interposer connector assembly 102 (shown in FIG. 1) toward the first electronic package 104. While the discussion herein focuses on the contacts 110 joined to the side 120 of the interposer connector assembly 102 and the conductive pad 200 of the first electronic package 104, the discussion may equally apply to the contacts 110 on the side 122 (shown in FIG. 1) of the interposer connector assembly 102 and the conductive pads 200 of the second electronic package 106 (shown in FIG. 1). The contact 110 is shown in phantom view to more clearly illustrate how the contact 110 is oriented relative to the via 214 of the first electronic package 104.

The contact 110 may define a footprint 600 on the mating surface 114 of the first electronic package 104. The footprint 600 is the surface area on the first electronic package 104 that is above the contact 110 in the view shown in FIG. 4 or 5. For example, the contact 110 may extend over a surface area of the first electronic package 104 that is defined by the footprint 600. As shown in FIG. 6, the footprint 600 of the contact 110 and the conductive pad 200 of the first electronic package 104 are elongated in a common direction 602. For example, the footprint 600 of the contact 110 is elongated between opposite edges 604, 606 that are associated with the edges 224, 226 of the contact 110. The footprint 600 is elongated between the edges 604, 606 along the direction 602 and the conductive pad 200 also is elongated along the direction 602.

The contact 110 may be oriented relative to the via 214 such that the footprint 600 at least partially overlaps or encompasses the via 214. In the illustrated embodiment, all of the via 214 is disposed within the footprint 600. For example, a surface area 608 of the via 214 may be entirely located within or may entirely overlap with the footprint 600 of the contact 110. The surface area 608 is the two dimensional cross-sectional area of the via 214. By way of example only, the surface area 608 may be represented by the area of the via 214 that is intersected by a plane that is perpendicular to the center axis 222 of the via 214. In one embodiment, the surface area 608 is the cross-sectional area of the opening or hole of the via 214. In another embodiment, the surface area 608 is the cross-sectional area of the conductive material in the via 214.

Alternatively, the via 214 may be partially disposed within the footprint 600. For example, less than all but at least a majority of the via 214 may be located within the footprint 600. The via 214 may be encompassed by the portion of the footprint 600 that is associated with the interconnecting portion 206 of the contact 110. Alternatively, the via 214 may be encompassed by the portion of the footprint 600 that is associated by a different end 202, 204 of the contact 110, or by a combination of the ends 202, 204 and/or section 206 of the contact 110. As described above, the noise that is induced onto other contacts 110 may be reduced by positioning the contact 110 relative to the via 214 such that the footprint 600 encompasses the via 214.

Dimensions, types of materials, orientations of the various components, and the number and positions of the various components described herein are intended to define parameters of certain embodiments, and are by no means limiting and are merely example embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. An electronic connector system comprising:
an electronic package having a body with a conductive member disposed on a mating surface of the body, the conductive member coupled with a conductive via that extends into the body and is oriented along a center axis; and
an interposer connector assembly including a substrate with an elongated conductive pad mounted to the substrate and a contact joined to the conductive pad, wherein the contact engages the conductive member when the electronic package mates with the interposer connector assembly such that the center axis extends through the contact; wherein
the contact of the interposer connector assembly extends over a footprint on the electronic package that is defined by a surface area on the electronic package over which the contact extends, at least a majority of the via disposed in the footprint.

2. The system according to claim 1, wherein the contact is disposed between the via of the electronic package and the substrate of the interposer connector assembly along the center axis of the via when the electronic package mates with the interposer connector assembly.

3. The system of claim 1, wherein the conductive pad includes a framing portion and a mounting portion spaced apart from each other, the framing portion extending around at least a portion of a periphery of the via, the contact engaging the mounting portion when the electronic package mates with the interposer connector assembly.

4. The system of claim 1, wherein the via comprises a hole extending into the body of the electronic package that is at least one of plated and filled with a conductive material, the conductive pad being electrically joined with the conductive material in the via.

5. The system of claim 1, wherein the contact has a footprint on the electronic package that is defined by a surface area on the mating surface of the electronic package over which the contact extends when the electronic package and the interposer connector assembly mate, the footprint and the conductive pad being elongated along a common direction.

6. The system of claim 1, wherein the electronic package is a first electronic package and the interposer connector assembly includes opposite first and second sides with a plurality of the contacts mounted on the first and second sides and electrically coupled with each other, further comprising a second electronic package having a conductive pad and a conductive via, the contacts of the interposer connector assembly engaging the conductive pads and extending over the vias of the first and second electronic packages when the first and second electronic packages engage the interposer connector assembly.

7. The system of claim 1, wherein the contact of the interposer connector assembly extends from a fixation end mounted to the conductive pad to an outer end, the center axis of the via extending through the contact between the fixation and the outer end when the electronic package engages the interposer connector assembly.

8. The system of claim 1, wherein the conductive pad is a first conductive pad and the via is a first conductive via, further comprising a second conductive pad mounted to the electronic package and a second conductive via coupled with the second conductive pad, wherein the contact of the interposer connector assembly engages the first conductive pad and the center axis of the second via extends through the contact.

9. An electronic connector system comprising:
an electronic package having a body with a conductive member disposed on a mating surface of the body, the conductive member coupled with a conductive via that extends into the body; and
an interposer connector assembly including a substrate with a conductive pad mounted to the substrate and an elongated contact joined to the conductive pad, wherein the contact having a footprint on the electronic package that is defined by a surface area on the mating surface of the electronic package over which the contact extends when the electronic package and the interposer connector assembly mate, further wherein at least a portion of the via is disposed within the footprint.

10. The system of claim 9, wherein the via is oriented along a center axis and the contact engages the conductive member when the electronic package mates with the interposer connector assembly such that the center axis extends through the contact.

11. The system according to claim 9, wherein the via is oriented along a center axis and the contact engages the conductive member when the electronic package mates with the interposer connector assembly, the contact being disposed between the via of the electronic package and the substrate of the interposer connector assembly along the center axis of the via when the electronic package mates with the interposer connector assembly.

12. The system of claim 9, wherein at least a majority of the via is disposed in the footprint when the electronic package and the interposer connector assembly mate with each other.

13. The system of claim 9, wherein the conductive pad is elongated and includes a framing portion and a mounting portion spaced apart from each other, the framing portion extending around at least a portion of a periphery of the via, the contact engaging the mounting portion when the electronic package mates with the interposer connector assembly.

14. The system of claim 9, wherein the via comprises a hole extending into the body of the electronic package that is at least one of plated and filled with a conductive material, the conductive pad being electrically joined with the conductive material in the via.

15. The system of claim 9, wherein the footprint of the contact and the conductive pad are elongated along a common direction when the electronic package and the interposer connector assembly mate with each other.

16. The system of claim 9, wherein the via is oriented along a center axis and the contact of the interposer connector assembly extends from a fixation end mounted to the conductive pad to an outer end, the center axis of the via extending through the contact between the fixation and the outer end when the electronic package engages the interposer connector assembly.

* * * * *